Dec. 2, 1969
J. F. INGLE
3,482,148

PULSE DRIVEN CIRCUIT FOR ACTIVATING AN ELECTROMAGNETIC DEVICE DURING AND FOR A PREDETERMINED INTERVAL LONGER THAN THE INPUT PULSE WIDTH

Filed Dec. 28, 1966

INVENTOR
J. F. INGLE
BY Daniel D. Dubosky
ATTORNEY

United States Patent Office 3,482,148

Patented Dec. 2, 1969

3,482,148

PULSE DRIVEN CIRCUIT FOR ACTIVATING AN ELECTROMAGNETIC DEVICE DURING AND FOR A PREDETERMINED INTERVAL LONGER THAN THE INPUT PULSE WIDTH

James F. Ingle, Fair Haven, N.J., assignor to Bell Telephone Laboratories, Incorporated, Murray Hill, N.J., a corporation of New York Filed Dec. 28, 1966, Ser. No. 605,333
Int. Cl. H01h 47/32
U.S. Cl. 317—148.5 5 Claims

ABSTRACT OF THE DISCLOSURE

An input pulse is coupled through a diode to activate a relay for the duration of the pulse. In addition, a first transistor switch causes a capacitor to be charged from a potential source through a first resistance in response to the input pulse. Discharge of the capacitor through a second resistance and the base-emitter junction of a second transistor causes the relay which is connected to the second transistor collector to remain in an activated state for a predetermined interval longer than the input pulse width.

This invention relates to a circuit for activating an electromagnetic device in response to a voltage pulse, and more particularly to a circuit which maintains the electromagnetic device activated for a predetermintеd interval longer than the width of the voltage pulse.

In the prior art, a monostable multivibrator has frequently been used to activate an electromagnetic device, Such as a relay, for a predetermined interval longer than the width of an input voltage pulse. The initial step of the input pulse is caused to trigger the monostable multivibrator into its unstable state, and the internal time constant of the circuit is so designed that the circuit remains in its unstable state for a predetermined interval longer than the width of the input pulse. In many applications, however, the lead upon which the input pulse is delivered to the monostable multivibrator also contains extraneous short interval noise pulses having voltage amplitudes comparable to the desired voltage pulse. In this environment, the simple two transistor monostable multivibrator without additional isolation circuitry would respond to the noise pulses and erroneously operate the electromagnetic device.

Accordingly, one object of the present invention is to activate an electromagnetic device and to maintain it in the activated state for a predetermined interval longer than an input voltage pulse by means which at the same time are immune to short interval noise pulses presented at the input.

The above and other objects are achieved in accordance with the present invention wherein an input voltage pulse is coupled through a diode to activate a relay for the duration of the voltage pulse. In addition, in response to the voltage pulse, a first transistor switching means causes a capacitor to be charged from a potential source through a first resistance. Discharge of the capacitor through a second resistance and the base-emitter junction of a second transistor means causes the relay which is connected to the collector of the second transistor means to remain in an activated state for a predetermined interval longer than the input pulse width.

As a result, noise pulses at the input do not activate the relay since they have insufficient energy to activate the relay through the diode and are of insufficient duration to permit any significant charging of the capacitor through the first resistance.

Figure 1:
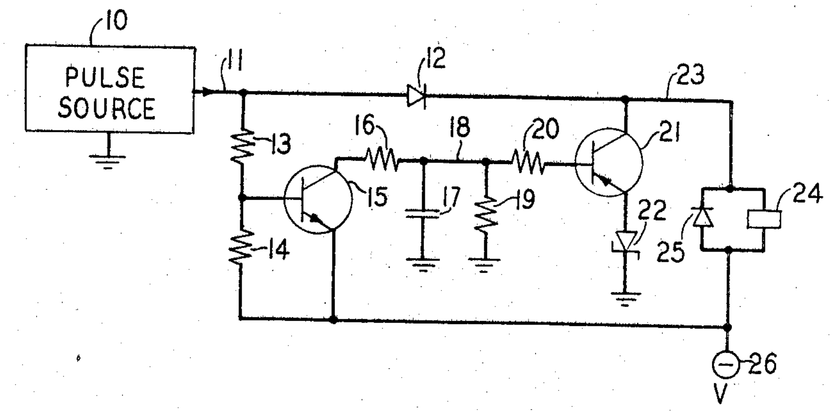
Figure 2:
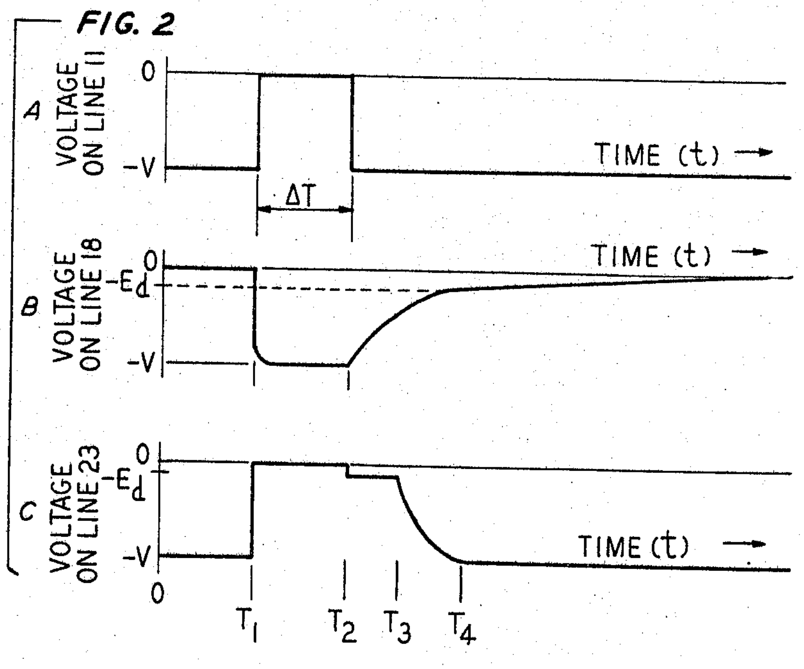

The features and attendant advantages of the instant invention will be better understood after a consideration of the following detailed description in combination with the accompanying drawings in which:

FIG. 1 is a schematic diagram of a circuit constructed in accordance with the present invention; and FIG. 2 is a presentation of voltage waveforms useful in the explanation of the circuit shown in FIG. 1.

In FIG. 1 pulse source 10 provides a voltage pulse of $\Delta T$ seconds in duration on line 11, as indicated in waveform A of FIG. 2 from $t=T_1$, to $t=T_2$ on the abscissa representing time from some arbitrary zero before the appearance of a pulse. Pulse source 10 can be a monostable multivibrator of the type shown in FIGS. 18–35 on page 600 of the textbook, "Pulse and Digital Circuits" by Millman and Taub, McGraw-Hill Book Company, Inc. (1956). For the particular embodiment of the invention shown in FIG. 1, the voltage on line 11 before the voltage pulse ($t<T_1$) is at —V volts, during the voltage pulse is a 0 volts, and after the voltage pulse ($t>T_2$) is againt at —V volts.

Line 11 is connected to the anode of a diode 12, the cathode of which is connected to line 23 which in turn is connected to one side of the winding of an electromagnetic device, relay 24. The other side of the winding of relay 24 is connected to a potential source 26 indicated in the drawing as providing a potential of —V volts. A diode 25 is connected in parallel with relay 24, the anode of diode 25 being connected to negative potential source 26. In addition, the input line 11 is connected through a resistor 13 to the base of an NPN transistor 15 and to one side of a resistor 14, the other side of which is connected to negative potential source 26. The emitter of transistor 15 is also connected to minus potential source 26 and the collector of transistor 15 is connected through a resistor 16 to one plate of a capacitor 17, the other plate of which is connected to a reference potential (here shown as ground potential). The junction of resistor 16 and capacitor 17 is connected by way of line 18 through a resistor 19 to reference potential and through a resistor 20 to the base of a PNP transistor 21. The collector of transistor 21 is connected to line 23, and the emitter of transistor 21 is connected through a Zener diode 22 to reference potential, the Zener diode 22 being poled oppositely from the base-emitter junction of transistor 21.

Prior to the appearance of the voltage pulse on line 11 (i.e. for $t<T_1$ in the waveforms of FIG. 2), line 11 is at —V volts as indicated in waveform A of FIG. 2, and therefore no potential difference exists across the voltage divider circuit consisting of resistors 13 and 14 connected in series between line 11 and negative potential source 26. Accordingly, the base and emitter of transistor 15 are at the same potential and therefore transistor 15 is not in conduction. The small collector cut-off current ($I_{co}$) of transistor 15 flows from reference potential through resistors 19 and 16 into the collector of transistor 15. In addition, the collector cut-off current ($I_{co}$) of transistor 21 flows from reference potential through resistors 19 and 20 into the base of transistor 21. The potential drop between the base of transistor 21 and reference potential which is produced by the two $I_{co}$'s through resistor 19 and the single $I_{co}$ through resistor 20 is insufficient however, to overcome the back-bias potential of Zener diode 22 and forward bias the base-emitter junction of transistor 21. Consequently, for $t<T_1$ transistor 21 is also not in conduction, and the collector of transistor 21 which is connected through line 23 and relay 24 to the negative potential source 26 is permitted to remain at a potential substantially equal to that of potential source 26 as indicated in waveform C of FIG. 2 for $t<T_1$.

In summary, for $t<T_1$ the only current flowing through relay 24 is the collector cut-off current ($I_{co}$) of transistor 21 and this is insufficient to operate the relay.

At $t=T_1$ the voltage pulse appears on line 11 and the negative potential on line 11 is decreased to 0 volt as indicated in waveform A of FIG. 2. As a result, diode 12 is forward biased, and line 23 is thereby clamped to about 0 volt as indicated in waveform C of FIG. 2 at $t=T_1$. The current flow from line 11 through diode 12 and through relay 24 to the negative potential source 26 causes the relay to be activated. In addition, the voltage pulse on line 11 causes a more positive potential to appear on the base of transistor 15 which in turn causes the base-emitter junction of the latter to be forward biased, and transistor 15 goes into conduction. As a result, capacitor 17 charges through resistor 16 and transistor 15 toward a potential equal to about the −V volts of negative potential source 26 as indicated in waveform B of FIG. 2. The potential to which capacitor 17 is charging is not reduced much from that of potential source 26 by the voltage divider effect of resistors 16 and 19 since resistor 16 is more than an order of magnitude lower in value than resistor 19. For the same reason, the rate at which capacitor 17 is charged is determined primarily by the time constant provided by capacitor 17 and resistor 16. This time constant need only be fast enough so that capacitor 17 will be fully charged in an interval of $\Delta T$ seconds, the width of the input voltage pulse, to substantially the same voltage each time a voltage pulse occurs. The time constant is long enough, however, to prevent any significant change in the voltage on capacitor 17 from occurring during those instants when a noise pulse appears on line 11 of sufficient amplitude to momentarily drive transistor 15 into conduction.

In an interval greater than the maximum width of any noise pulse expected on line 11, the voltage on capacitor 17 is sufficiently negative with respect to reference potential such that the back-bias potential of Zener diode 26 is overcome and the base-emitter junction of transistor 21 is forward biased. Resistor 20, connected between capacitor 17 and the base of transistor 21, like resistor 19 is also more than an order of magnitude greater in value than resistor 16, and therefore its insertion into the charging circuit of capacitor 17 does not substantially alter the charging rate or final voltage to which the capacitor 17 charges in the interval of $\Delta T$ seconds.

At $t=T_2$, the voltage pulse on line 11 is terminated, and the voltage on line 11 drops back to −V volts as indicated in waveform A of FIG. 2. As a result, diode 12 is back-biased and therefore relay 24 can no longer be maintained in an active state by current through the diode. Transistor 21, however, is in conduction and therefore line 23 is immediately clamped to the back-biased potential ($E_d$) of the Zener diode 22, as indicated in waveform C of FIG. 2 at $t=T_2$. The back-biased potential of Zener diode 22 is small as compared with the negative potential of source 26, and therefore, the current from reference potential through diode 22, transistor 21 and relay 24 to potential source 26 is sufficient to maintain relay 24 in an activated state.

After $t=T_2$, transistor 15 is no longer in conduction, and therefore capacitor 17 is no longer clamped through resistor 16 and transistor 15 to potential source 26. Hence, for $t>T_2$ capacitor 17 discharges through resistor 19 and through resistor 20, the base-emitter junction of transistor 21 and Zener diode 22 toward reference potential, as indicated in waveform B of FIG. 2. At $t=T_3$, a predetermined interval after the termination of the input voltage pulse at $t=T_2$, the voltage across capacitor 17 (i.e. on line 18) has fallen to a value which is insufficient to maintain transistor 21 in saturation. Consequently, transistor 21 proceeds out of saturation as the negative potential on line 18 decreases even further, and transistor 21 presents an increasing impedance to current flow via line 23 to relay 24, as indicated by the increasing negative potential in waveform C of FIG. 2 for $t>T_3$. A short interval after $t=T_3$, the current through relay 24 is no longer sufficient to maintain the relay in its activated state, and therefore relay 24 releases and returns to the inactive state which existed for $t<T_1$.

Diode 25 is connected in parallel with relay 24 in order to by-pass the transient which develops as a result of the attempt by the inductance inherent in the winding of relay 24 to maintain current flow even though transistor 21 is cut-off. Without this diode damage to transistor 21 could result at $t=T_3$.

At $t=T_4$, the negative potential on line 18 has decreased to the back-biased potential ($E_d$) of Zener diode 22. Consequently, the base-emitter junction of transistor 21 is no longer forward biased, and transistor 21 is cut-off, as indicated at $t=T_4$ in waveform C of FIG. 2 by the return of line 23 to the potential of negative potential source 26. For $t>T_4$, capacitor 17 is no longer able to discharge through the path which includes the base-emitter junction of transistor 21 but continues to discharge through resistor 19 toward zero volt as indicated in waveform B of FIG. 2. As further indicated in the waveforms of FIG. 2, after $t=T_4$ the circuit returns in its entirety to the conditions which existed as described hereinabove for $t<T_1$.

What has been described hereinabove is a specific illustrative embodiment of the present invention. Numerous modifications may be made by those skilled in the art without departing from the spirit and scope of the present invention. For example, changes in the pulse polarity with corresponding changes in the potential source, the poling of diodes, and type of transistors can be made with no resulting changes in the operation of the circuit.

What is claimed is:

1. A circuit for activating an electromagnetic device for a predetermined interval longer than the width of an input voltage pulse, said circuit comprising diode means for activating the electromagnetic device in response to the input voltage pulse, transistor means connected to said electromagnetic device to activate the device when the base-emitter junction of said transistor means is forward biased, a capacitor means for storing a charge potential, a first resistance means for discharging said capacitor means through said base-emitter junction, a switching means for charging said capacitor means through a second resistance means in response to said input voltage pulse, whereby said capacitor means is charged to an interval less than the input voltage pulse width and is discharged through said first resistance means and said base-emitter junction in said predetermined interval longer than said input voltage pulse width, and a Zener diode connected in series with said base-emitter junction and oppositely poled thereto in order to insure that the base-emitter junction of said transistor means is not forward biased by the charging of said capacitor through said first resistance means in response to any extraneous noise pulse which appears in place of said input voltage pulse.

2. A circuit for activating an electromagnetic device for a predetermined interval longer than the width of an input voltage pulse, said circuit comprising diode means for coupling the input voltage pulse to the electromagnetic device, transistor means connected to said electromagnetic device so as to activate said device when the base-emitter junction of said transistor means is forward biased, a second diode means connected in series with said base-emitter junction and oppositely poled thereto, capacitor means for storing a charge potential, a first resistance means for discharging said capacitor means through said base-emitter junction and said second diode means when the charge potential on said capacitor means exceeds the back-biased potential of said second diode means, a second resistance means, and a switching means for charging said capacitor means through said second resistance means in response to said input voltage pulse, whereby the charging of said capacitor means to the back-biased potential of said second diode means requires an interval less than the input voltage pulse width but greater than the width of any extraneous noise pulse which appears in place of said input voltage pulse.

3. A circuit as defined in claim 2 wherein said switching means includes a transistor having base, emitter, and collector electrodes, first means connecting said collector electrode to said second resistance means, second means connecting said emitter electrode to a potential source, and a voltage divider means connecting said input voltage pulse to said base electrode.

4. A circuit for activating an electromagnetic device for a predetermined interval longer than the width of an input voltage pulse, said circuit comprising first diode means for coupling the input voltage pulse to said electromagnetic device, a second diode means having a back-biased potential, a transistor having base, emitter and collector electrodes, means connecting said collector electrode to said electromagnetic device, means connecting said emitter electrode through said second diode means to a reference potential, said second diode means being poled oppositely to the base-emitter junction of said transistor, a capacitor having one plate connected to reference potential and the other plate connected through a first resistance means to the base electrode of said first transistor, a second resistance means connected to said other plate, and a switching means connected to said second resistance means for charging said capacitor through said second resistance means in response to said input voltage pulse, the interval during which said capacitor is charged to a potential greater than said back-biased potential being less than said input voltage pulse width but greater than the width of any extraneous noise pulse which appears in place of said input voltage pulse.

5. A circuit as defined in claim 4 wherein said switching means includes a second transistor having base, emitter and collector electrodes, the collector electrode of said second transistor connected to said second resistance means, the emitter electrode of said second transistor connected to a potential source, and a voltage divider means connecting said input voltage pulse to the base electrode of said second transistor.

References Cited

UNITED STATES PATENTS

| | | | |
|---|---|---|---|
| 3,067,344 | 12/1962 | Branum et al. | 307—267 X |
| 3,119,027 | 1/1964 | Faust | 317—123 X |
| 3,211,926 | 12/1965 | Frysinger | 307—267 X |
| 3,299,289 | 1/1967 | McDowell et al. | 307—267 |

LEE T. HIX, Primary Examiner

W. M. SHOOP, Jr., Assistant Examiner